United States Patent
Yoon

(10) Patent No.: US 11,659,736 B2
(45) Date of Patent: May 23, 2023

(54) LIGHT EMITTING DISPLAY DEVICE

(71) Applicant: LG Display Co., Ltd., Seoul (KR)

(72) Inventor: Sung-Ji Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 121 days.

(21) Appl. No.: 17/129,481

(22) Filed: Dec. 21, 2020

(65) Prior Publication Data

US 2021/0202632 A1 Jul. 1, 2021

(30) Foreign Application Priority Data

Dec. 31, 2019 (KR) .......................... 10-2019-0180203

(51) Int. Cl.
*H01L 27/32* (2006.01)

(52) U.S. Cl.
CPC ...... *H01L 27/3248* (2013.01); *H01L 27/3246* (2013.01)

(58) Field of Classification Search
CPC ............ H01L 27/3246; H01L 27/3248; H01L 27/3274; H01L 51/5056; H01L 51/5088
See application file for complete search history.

(56) References Cited

U.S. PATENT DOCUMENTS

| 10,784,459 | B2* | 9/2020 | Naganuma | .......... H01L 51/5092 |
| 2012/0187425 | A1* | 7/2012 | Omoto | ................ H01L 27/3248 257/40 |
| 2014/0042400 | A1 | 2/2014 | Kim et al. | |
| 2016/0118449 | A1* | 4/2016 | Sato | ..................... H01L 51/5203 257/89 |

FOREIGN PATENT DOCUMENTS

| JP | 2012-155953 A | 8/2012 |
| KR | 10-2014-0020058 A | 2/2014 |

* cited by examiner

*Primary Examiner* — Fernando L Toledo
*Assistant Examiner* — Valerie N Newton
(74) *Attorney, Agent, or Firm* — Morgan, Lewis & Bockius LLP

(57) ABSTRACT

Disclosed is a light emitting display device which may block lateral leakage current. The light emitting display device includes electrode patterns arranged under a bank between adjacent subpixels so as to form a vertical channel, the bank covered by the electrode patterns functions as a gate insulating film and thus dielectric polarization occurs therein, and charges move from a common layer having high hole mobility to a common layer having low hole mobility, thereby being capable of preventing lateral leakage current.

19 Claims, 6 Drawing Sheets

LIGHT EMITTING DISPLAY DEVICE

This application claims the benefit of Korean Patent Application No. 10-2019-0180203, filed on Dec. 31, 2019, which is hereby incorporated by reference as if fully set forth herein.

BACKGROUND

Technical Field

The present disclosure relates to a light emitting display device, and more particularly, to a light emitting display device which prevents lateral leakage current due to common layers by providing an additional electrode under a bank.

Discussion of the Related Art

As society has recently entered the information age, the field of displays for visually displaying electrical information signals has rapidly developed and, in order to satisfy such development, various flat display devices having excellent performance, such as slimness, light weight and low power consumption, have been developed and have rapidly replaced conventional cathode ray tubes (CRTs). As examples of such display devices, there are a liquid crystal display (LCD) device, a plasma display panel (PDP) device, a field emission display (FED) device, an organic light emitting diode (OLED) display device, a quantum dot display device, etc.

Thereamong, a light emitting display device, which does not require a separate light source and achieves compactness and clear color display, is considered as a competitive application.

Such a light emitting display device includes a plurality of subpixels, and a light emitting element is provided in each of the subpixels, thus emitting light without a separate light source.

Each light emitting element includes a light emitting layer and a common layer provided between the light emitting layer and an electrode, and the common layer connects the respective subpixels and may thus cause lateral leakage current.

SUMMARY

Accordingly, embodiments of the present disclosure are directed to a light emitting display device that substantially obviates one or more problems due to limitations and disadvantages of the related art.

An object of the present disclosure is to provide a light emitting display device which prevents lateral leakage current due to common layers by providing an additional electrode under a bank.

Another object of the present disclosure is to provide a light emitting display device in which electrode patterns are provided under a bank between adjacent subpixels so as to form a vertical channel, and the bank covered by the electrode patterns functions as a gate insulating film and may thus block lateral leakage current.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display device comprises a bank configured to open first light emitting parts and second light emitting parts adjacent to each other, first anodes and second anodes provided in the first light emitting parts and the second light emitting parts, respectively, and spaced apart from each other, electrode patterns configured to be covered by the bank and spaced apart from the first and second anodes, a first and second common layers provided on the first and second anodes and the bank and configured to have different carrier mobilities, a first light emitting layer and a second light emitting layer provided on the second common layer in the first light emitting parts and the second light emitting parts, respectively, and a cathode provided on the first and second light emitting layers.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION

Figure 1:
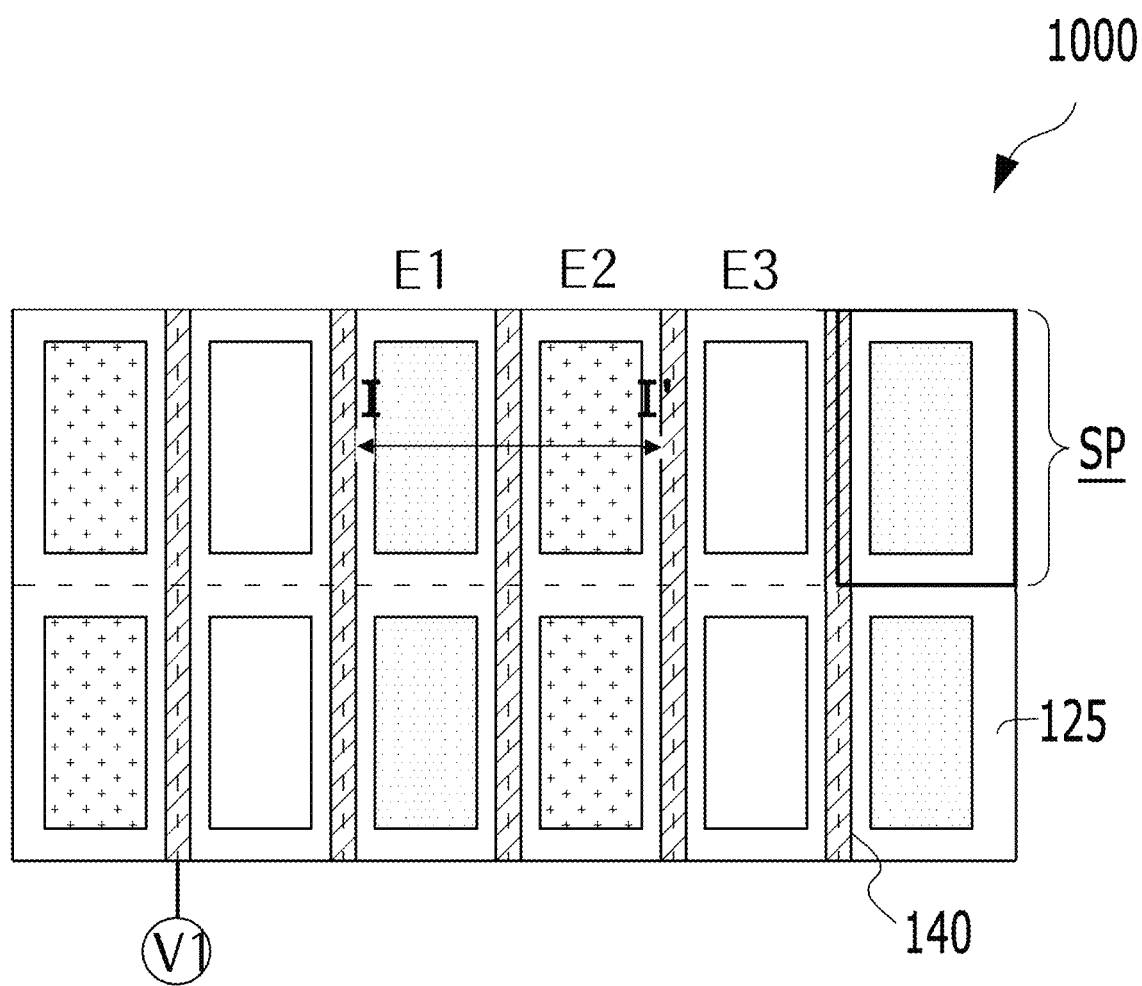
FIG. 1 is a plan view illustrating a light emitting display device according to the present disclosure.

Reference will now be made in detail to exemplary embodiments of the present disclosure, examples of which are illustrated in the accompanying drawings. In the following description of the embodiments and the drawings, the same or similar elements are denoted by the same reference numerals throughout the specification. In the following description of the embodiments of the present disclosure, a detailed description of known functions and configurations incorporated herein will be omitted when it may make the subject matter of the present disclosure rather unclear. Further, the names of elements used in the following description of the embodiments of the present disclosure are selected in consideration of ease of preparation of the specification, and may thus differ from the names of parts of an actual product.

Shapes, sizes, rates, angles and numbers disclosed in the drawings to describe the embodiments of the present disclosure are only exemplary and do not limit the present disclosure. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of characteristics, numbers, steps, operations, elements, parts or combinations thereof, or the possibility of adding the same, unless the term "only" is used. It will be understood that a singular expression encompasses a plural expression unless stated otherwise.

In the interpretation of elements included in the various embodiments of the present disclosure, it is to be interpreted that the elements include error ranges unless stated otherwise.

In the following description of the embodiments, it will be understood that, when positional relationships are expressed, for example, when an element is "on", "above", "under" or "beside" another element, the two elements may directly contact each other, or one or more other elements may be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to discriminate the same or similar elements. Therefore, a first element described hereinafter may be a second element without departing from the technical scope of the disclosure.

Respective features of the various embodiments of the present disclosure may be partially or wholly coupled to or combined with each other and be interlocked or driven in various technical manners, and the respective embodiments may be implemented independently of each other or be implemented together through connection therebetween.

Figure 2:
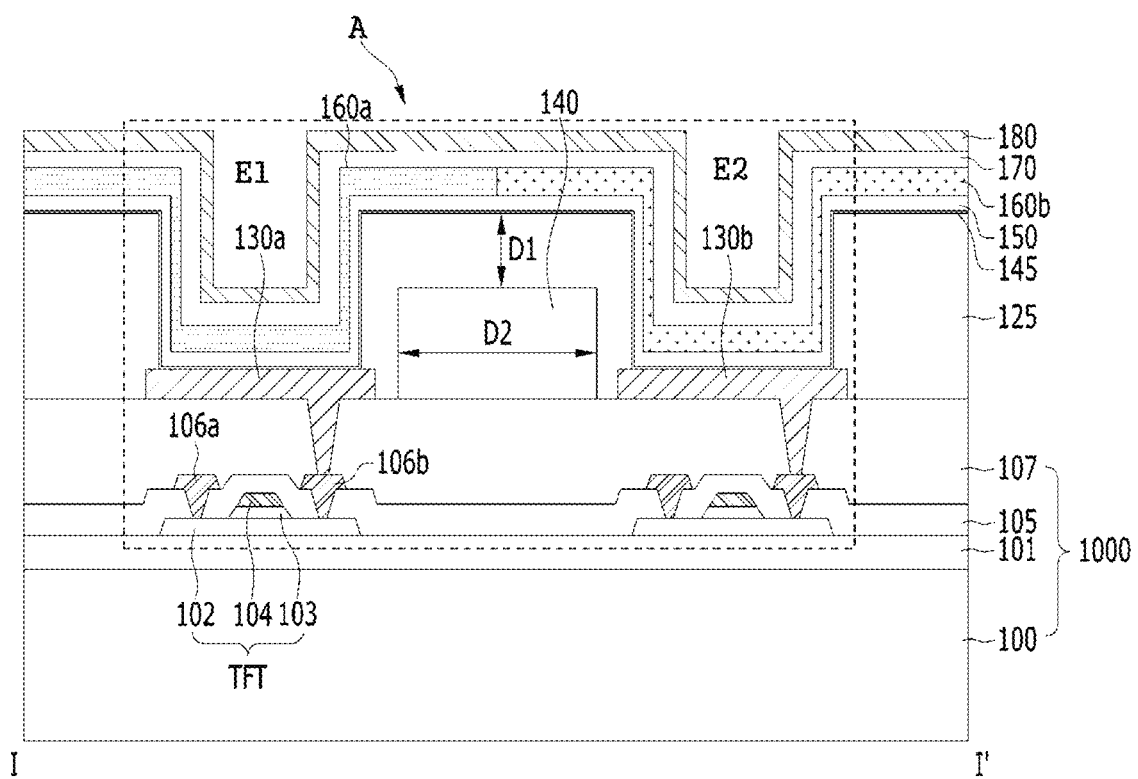
FIG. 2 is a cross-sectional view taken along line I-I' of FIG. 1.

FIG. 1 is a plan view illustrating a light emitting display device according to the present disclosure, and FIG. 2 is a cross-sectional view taken along line I-I' of FIG. 1.

As shown in FIGS. 1 and 2, the light emitting display device according to the present disclosure may include, on a substrate 1000, a bank 125 configured to open first light emitting parts E1 and second light emitting parts E2 adjacent to each other, first anodes 130a and second anodes 130b provided in the first light emitting parts E1 and the second light emitting parts E2, respectively, and spaced apart from each other, electrode patterns 140 configured to be covered by the bank 125 and spaced apart from the first and second anodes 130a and 130b, first and second common layers 145 and 150 formed on the first and second anodes 130a and 130b and the bank 125 and having different carrier mobilities, a first light emitting layer 160a and a second light emitting layer 160b provided on the second common layer 150 respectively in the first light emitting parts E1 and the second light emitting parts E2, and a cathode 180 provided on the first and second light emitting layers 160a and 160b.

The respective anodes 130a and 130b partially overlap the edges of corresponding regions of the bank 125, and the first, second and third light emitting parts E1, E2 and E3 are defined in areas exposed by the bank 125. The light emitting display device according to the present disclosure is characterized in that the electrode pattern 140 is added to the area of the bank 125 in addition to the anodes 130a and 130b.

The electrode pattern 140 is provided in the area of the bank 125 other than the anodes 130a and 130b, the light emitting layers 160a and 160b and the cathode 180, which function as light emitting elements, so that the electrode pattern 140, the bank 125 and elements provided thereon, particularly, the common layers 145 and 150, function as a channel and thus induce blockage of lateral current.

Here, the electrode pattern 140 functions as a kind of gate electrode of an organic thin film transistor generated in the area of the bank 125 (with reference to region A), and the bank 125 functions as a gate insulating film. The channel function of the organic thin film transistor is exhibited when voltage V1 is applied to the electrode pattern 140.

If the thin film transistor TFT of the first light emitting part E1 is turned on and the thin film transistor TFT of the second light emitting part E2 is turned off, when holes move along the first common layer 145 having high hole mobility and voltage V1 is applied to the electrode pattern 140, dielectric polarization occurs in the bank 125 on the electrode pattern 140, and a vertical channel may be generated between the first common layer 145 and the second common layer 150.

In the light emitting display device according to the present disclosure, the electrode patterns 140 extend into a linear shape so as to receive voltage, and extends to the outside of an active area AA of the substrate 1000 provided with subpixels SP formed therein, thereby being capable of receiving voltage.

Lateral leakage current is observed through occurrence of unintended light emission by the second light emitting part E2 having a relatively low threshold voltage, adjacent to the first light emitting part E1 when the first light emitting part E1 having a relatively high threshold voltage is driven at a low grayscale level.

Problems due to lateral leakage current are mainly observed when the first light emitting part E1 is a blue light emitting part and the second light emitting part E2 is another colored light emitting layer. However, the disclosure is not limited thereto, and under the condition that a light emitting part of a color other than blue is driven at a low grayscale level, light emission by an adjacent light emitting part in an unlit state may be regarded as lateral leakage current.

It is considered that lateral leakage current is generated because the first common layer 145 formed as the lowermost layer out of organic layers is shared by the respective subpixels after formation of the anodes 130a and 130b, and in order to lower an interfacial barrier between the anodes 130a and 130b and the organic layers, the first common layer 145 is doped with a P-type dopant having the highest hole mobility.

In the present disclosure, a channel, in which holes are moved in the vertical direction from the first common layer 145 having high hole mobility to the second common layer 150, is formed by applying voltage to the electrode pattern 140 provided under the bank 125, and thus, lateral leakage current flowing towards an adjacent subpixel when the first light emitting part E1 is driven, is converted into the vertical direction, thereby being capable of preventing the second light emitting part E2 of the adjacent subpixel from being turned on.

For example, the first common layer 145 may be a hole injection layer, and the second common layer 150 may be a hole transport layer. The first common layer 145 has relatively high hole mobility due to use of the P-type dopant, and the second common layer 150 is involved in transport of holes between the anode 130a or 130b and the light emitting layer 160a or 160b, adjusts an optical distance of the light emitting layers 160 and 160b to adjust an emission zone, and has lower hole mobility than that of the first common layer 145.

The electrode patterns 140 may be provided to surround the first emitting parts E1.

Since voltage V1 applied to the electrode pattern 140 must be sufficient to generate dielectric polarization in the bank 125 functioning as the gate insulating film, voltage higher than ground voltage applied to the cathode 180 or negative voltage having a difference therewith may be applied as the voltage V1.

The electrode patterns 140 may be formed through the same process as the anodes 130a and 130b without being limited thereto, or be formed through a separate process. Otherwise, the thickness of regions of the bank 125 located on the electrode patterns 140 must be smaller than the thickness of other regions of the bank 125, so that, when voltage is applied to the electrode pattern 140, dielectric polarization occurs in the bank 125, and for this purpose, the electrode patterns 140 may have a great thickness. In this case, a first-layer electrode of the electrode patterns 140 may be formed through the same process as the anodes 130a and 130b, a second-layer electrode of the electrode patterns 140 may be additionally formed on the first-layer electrode, and thereby, the thickness of the electrode patterns 140 may be adjusted.

The great thickness of the electrode patterns 140 is not a requirement for transfer of carriers between the first and second common layers 145 and 150 on the electrode patterns 140 and the bank 125, and the thickness of the bank 125 functioning as the gate insulating film is more important than the thickness of the electrode patterns 140. The thickness D1 of the bank 125 on the electrode patterns 140 is about 1 μm (1,000 nm) or less, and more particularly, may be in the range of 10 nm to 1,000 nm.

Further, a width D2 of the electrode patterns 140 is smaller than a distance between the anodes 130a and 130b, and the reason for this is to distinguish the electrode patterns 140 from the first and second anodes 130a and 130b adjacent thereto so as to electrically operate the electrode patterns 140.

The bank 125 may include at least one of polyimide, polymethyl methacrylate, an oxide film and a nitride film. The bank 125 may be formed by stacking two different kinds of material layers, as circumstances require. In some cases, there may be a height difference between regions provided with the electrode patterns 140 and regions not provided with the electrode patterns 140.

Although the example shown in FIG. 1 illustrates that the electrode patterns 140 are located under the bank 125 provided between the respective subpixels in the vertical direction so as to control lateral leakage current in the respective subpixels, the disclosure is not limited thereto.

The electrode patterns 140 may be formed around only the first light emitting parts E1 having a high threshold voltage which is the main factor causing lateral leakage current to an adjacent subpixel.

That is, lateral leakage current may be controlled by providing the electrode patterns 140 at only both sides of the first light emitting parts E1 and applying voltage to the electrode patterns 140.

Further, the example shown in FIG. 1 illustrates that the light emitting parts of the same color are arranged in a column, and the electrode patterns 140 are arranged in a linear shape.

Otherwise, if the light emitting parts are arranged in a polygonal shape, the electrode patterns 140 may be formed under the bank 125 so as to surround the periphery of the light emitting parts arranged in the polygonal shape. In this case, the electrode patterns 140 may be arranged in a matrix.

Alternatively, the electrode patterns 140 are formed in both diagonal directions and may thus receive voltage signals in the diagonal directions in an active area.

Referring to FIG. 2, elements that have not been described above will be described.

Each of the first, second and third light emitting parts E1, E2 and E3 includes the anode 130a or 130b, the first common layer 145, the second common layer 150, the light emitting layer 160a or 160b, a third common layer 170 and the cathode 180, thus forming a light emitting element.

The third common layer 170 may be a layer relating to transport of holes, i.e., an electron transport layer, and include a hole blocking layer contacting the light emitting layer 160a or 160b or an electron blocking layer contacting the cathode 180, as circumstances require.

An organic light emitting element including an organic layer as the light emitting layer 160a or 160b or an inorganic light emitting element including an inorganic layer, such as quantum dots, as the light emitting layer 160a or 160b may be applied to the light emitting display device of the present disclosure.

Each anode 130a and 130b partially overlaps the edge of a corresponding region of the bank 125, and a region exposed by the bank 125 is defined as the light emitting part E1 or E2.

The light emitting part E1 may be a blue light emitting part without being limited thereto, and may be a colored light emitting part which may have the greatest influence on lateral leakage current towards other colored light emitting parts at a low grayscale level, as described above.

The substrate 1000 may include a base material and a thin film transistor array.

Each of the anodes 130 and 130b may be connected to the thin film transistor.

For example, the thin film transistor may include a semiconductor layer 102 formed on a buffer layer 101 on the base material, a gate insulating film 103 and a gate electrode 104 which are sequentially formed to partially overlap the semiconductor layer 102, and a source electrode 106a and a drain electrode 106b connected to both sides of the semiconductor layer 102.

An interlayer insulating film 105 may be further formed between the gate insulating film 103 and gate electrode 104 and the source and drain electrodes 106a and 106b, and as circumstances require, a coplanar structure may be applied to the thin film transistor by omitting the interlayer insulating film 105 and forming the gate electrode 104 and the source and drain electrodes 106a and 106b in the same layer.

The semiconductor layer 102 may be formed of, for example, an oxide semiconductor, amorphous silicon, polycrystalline silicon or a combination of two or more thereof.

Further, a planarization film 107 may be provided on the thin film transistors TFTs, and the anodes 103a and 103b may be provided on the planarization film 107.

Each anode 130a or 130b may be connected to the drain electrode 106b of the thin film transistor TFT in a corresponding subpixel.

Hereinafter, the operation of the light emitting display device of the present disclosure before and after applying voltage to the electrode patterns 140 will be described.

Figure 3A:
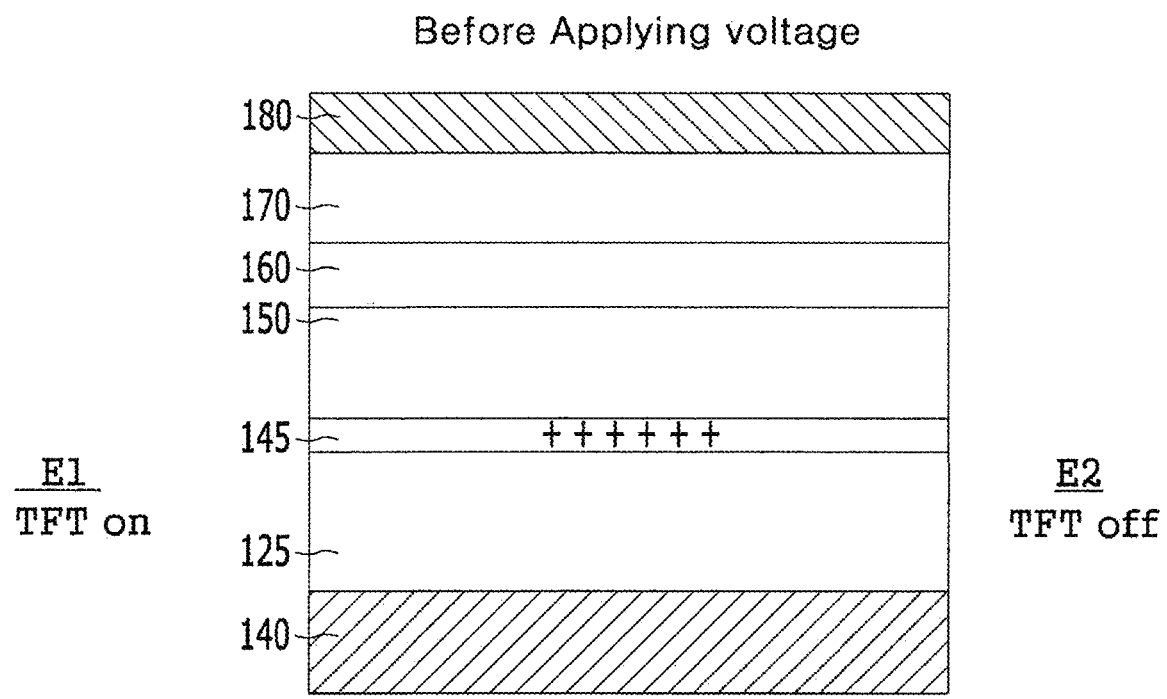
FIGS. 3A and 3B are views illustrating transfer of charges in region A of FIG. 2 before and after applying voltage.
Figure 3B:
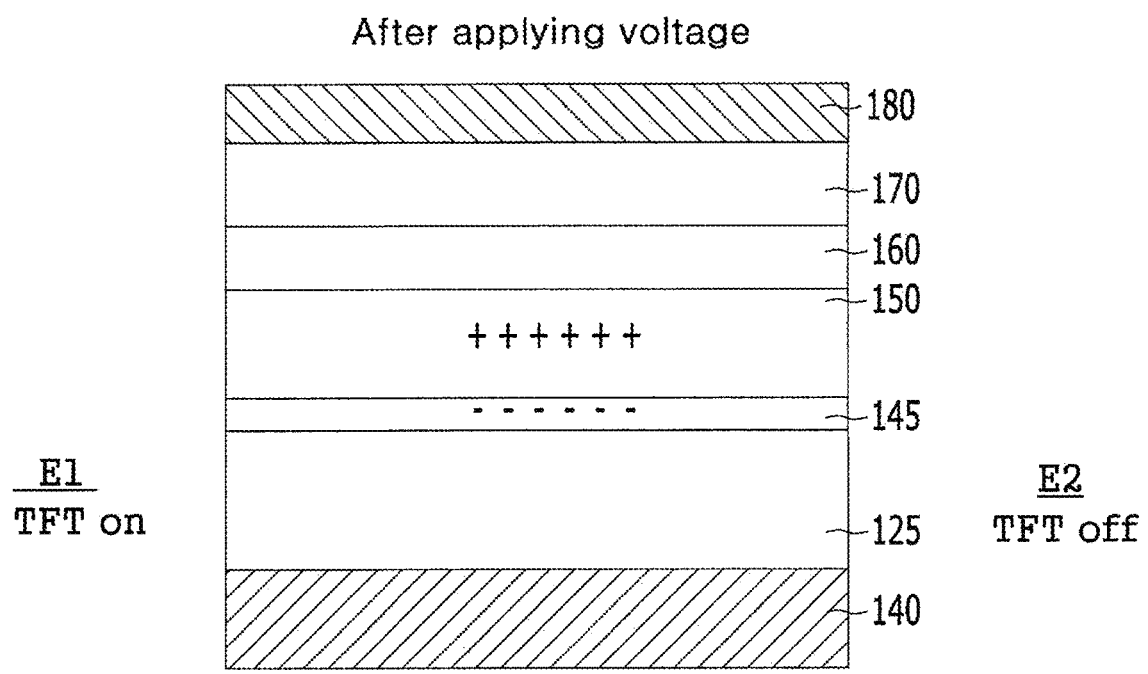

FIGS. 3A and 3B are views illustrating transfer of charges in region A of FIG. 2 before and after applying voltage.

As shown in FIG. 3A, in a state in which voltage is applied to the electrode patterns 140, holes are transferred to an adjacent subpixel due to the high hole mobility of the first common layer 145.

Here, before voltage is applied to the electrode patterns 140, the anodes 130 and 130b of adjacent first and second light emitting parts E1 and E2 function as a source electrode and a drain electrode, and current flows therebetween through the first common layer 145.

Thereafter, as shown in FIG. 3B, when voltage is applied to the electrode patterns 140, dielectric polarization occurs in the bank 125, and thereby, electrons are arranged towards the electrode patterns 140, to which voltage is applied, in the bank 125 and holes are arranged towards the other side in the bank 125. Although positive voltage or negative voltage is used as the voltage applied to the electrode patterns 140, voltage differing from the voltage of the cathode 180 in the ground state may be applied to the electrode patterns 140 so as to more effectively form a vertical channel.

The reason for this is that the vertical channel is formed in the common layer 145 in which holes moved laterally before voltage is applied to the electrode patterns 140, and thus causes transfer of the holes to the second common layer 150 and blocks the path of current flowing in the lateral direction.

That is, an inverse channel which may block the lateral current path is formed in the first and second common layers 145 and 150, thereby being capable of preventing lateral leakage current.

Thereby, the light emitting display device according to the preset disclosure may prevent light of various colors from mixing, thus being capable of improving poor image quality.

Figure 4:
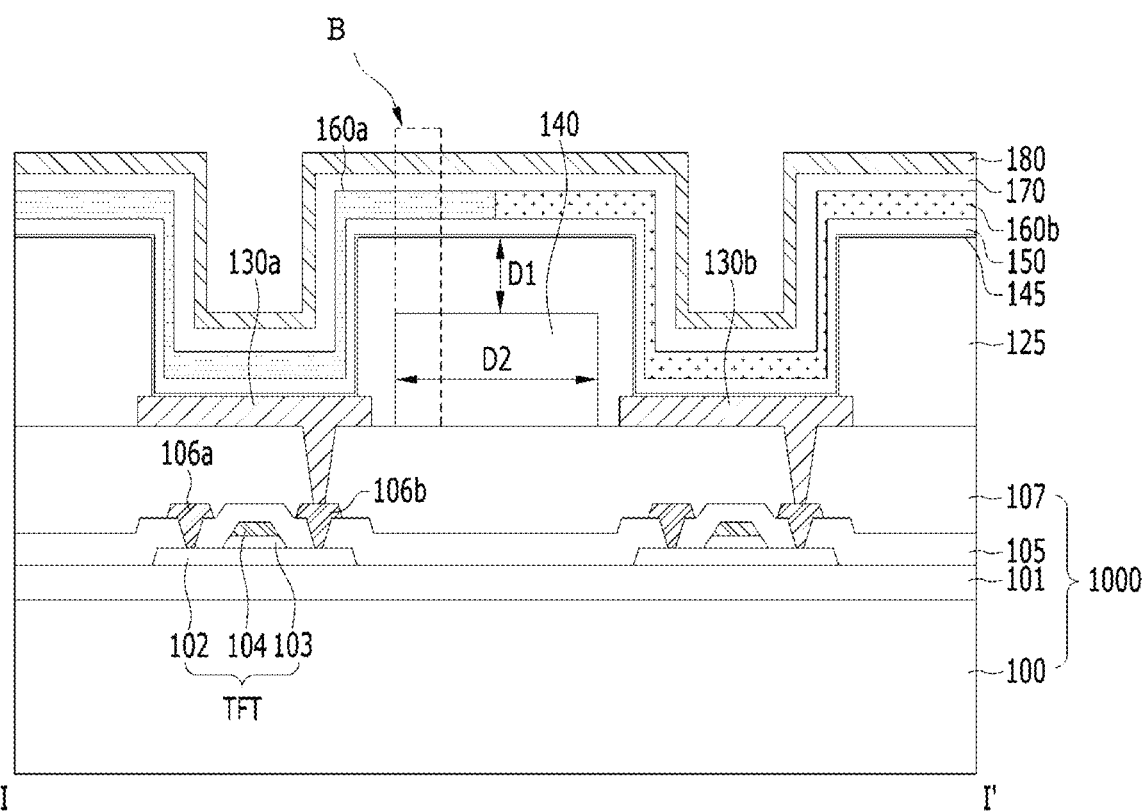
FIG. 4 is a cross-sectional view of region B of FIG. 2.
Figure 5:
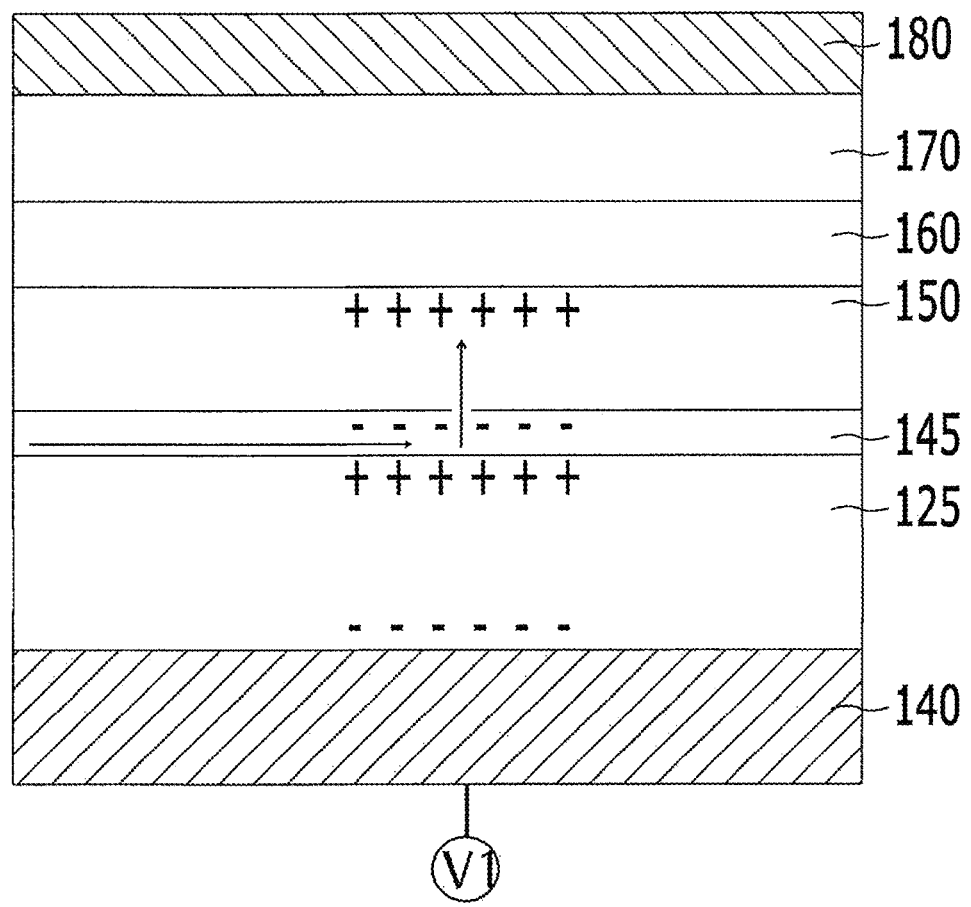
FIG. 5 is a view illustrating a current path when a channel of FIG. 4 is formed.

FIG. 4 is a cross-sectional view of region B of FIG. 2, and FIG. 5 is a view illustrating a current path when the channel of FIG. 4 is formed.

As shown in FIGS. 4 and 5, in the light emitting display device of the present disclosure, the electrode patterns 140 are formed in the linear shape so as to receive a voltage signal V1 at the outside of the active area AA, thus being capable of controlling lateral leakage current in the overall active area.

The present disclosure relates the light emitting display device which may block lateral leakage current, and the light emitting display device includes the electrode patterns 140 arranged under the bank 125 between adjacent subpixels SP so as to form a vertical channel, the bank 125 covered by the electrode patterns 140 functions as a gate insulating film and thus dielectric polarization occurs therein, and charges move from a common layer having high hole mobility to a common layer having low hole mobility, thereby being capable of preventing lateral leakage current.

A light emitting display device according to one embodiment of the present disclosure includes a bank configured to open first light emitting parts and second light emitting parts adjacent to each other, first anodes and second anodes provided in the first light emitting parts and the second light emitting parts, respectively, and spaced apart from each other, electrode patterns configured to be covered by the bank and spaced apart from the first and second anodes, a first and second common layers provided on the first and second anodes and the bank and configured to have different carrier mobilities, a first light emitting layer and a second light emitting layer provided on the second common layer in the first light emitting parts and the second light emitting parts, respectively, and a cathode provided on the first and second light emitting layers.

When voltage is applied to the electrode patterns, a channel in a vertical direction from the first common layer and the second commonly layer may be formed through the bank.

Hole mobility of the first common layer may be higher than hole mobility of the second common layer.

The electrode patterns may be provided to surround the first light emitting parts.

The electrode patterns may be formed in a linear shape so as to pass between the first light emitting parts and the second light emitting parts.

Voltage different from voltage applied to the cathode may be applied to the electrode patterns.

A second thickness of regions of the bank configured not to overlap the electrode patterns may be greater than a first thickness of regions of the bank configured to overlap the electrode patterns.

The first thickness may be in a range of 10 nm to 1,000 nm.

The bank may include at least one of polyimide, polymethyl methacrylate, an oxide film and a nitride film.

The thickness of the electrode patterns may be greater than the thickness of the first anodes and the second anodes.

As is apparent from the above description, a light emitting display device according to the present disclosure has the following effects.

Electrode patterns are additionally provided in a bank area so as to convert a lateral leakage current path into a vertical channel, thereby eliminating lateral leakage current.

Therefore, poor image quality due to mixing of light of different colors may be improved.

It will be apparent to those skilled in the art that various modifications and variations can be made in the light emitting display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display device, comprising:
a bank configured to open first light emitting parts and second light emitting parts adjacent to each other;
first anodes and second anodes in the first light emitting parts and the second light emitting parts, respectively, and spaced apart from each other;
electrode patterns configured to be covered by the bank and spaced apart from the first and second anodes, wherein a vertical gap is disposed between each of the electrode patterns and an upper surface of the bank;
a first common layer and a second common layer on the first and second anodes and the bank, and configured to have different carrier mobilities;
a first light emitting layer and a second light emitting layer on the second common layer in the first light emitting parts and the second light emitting parts, respectively; and
a cathode on the first light emitting layer and the second light emitting layer.

2. The light emitting display device according to claim 1, wherein, when voltage is applied to the electrode patterns, a channel is formed through the bank in a vertical direction from the first common layer to the second common layer.

3. The light emitting display device according to claim 2, a voltage higher than ground voltage applied to the cathode or negative voltage having a difference therewith is applied as the voltage.

4. The light emitting display device according to claim 1, wherein the first anodes and the second anodes partially overlap an edge of a corresponding region of the bank.

5. The light emitting display device according to claim 1, a width of the electrode patterns is smaller than a distance between the first anodes and the second anodes.

6. The light emitting display device according to claim 2, wherein hole mobility of the first common layer is higher than hole mobility of the second common layer.

7. The light emitting display device according to claim 1, wherein at least one of the electrode patterns surrounds at least one of the first light emitting parts.

8. The light emitting display device according to claim 1, wherein at least one of the electrode patterns is a linear shape in parallel with the adjacent first light emitting part and second light emitting part.

9. The light emitting display device according to claim 1, wherein voltage different from voltage applied to the cathode is applied to the electrode patterns.

10. The light emitting display device according to claim 1, wherein a first thickness of regions of the bank configured to overlap the electrode patterns is smaller than a second thickness of regions of the bank configured not to overlap the electrode patterns.

11. The light emitting display device according to claim 10, wherein the first thickness is in a range of 10 nm to 1,000 nm.

12. The light emitting display device according to claim 1, wherein the bank comprises at least one of polyimide, polymethyl methacrylate, an oxide film and a nitride film.

13. The light emitting display device according to claim 1, wherein a thickness of the electrode patterns is greater than a thickness of the first anodes and the second anodes.

14. The light emitting display device according to claim 1, wherein a lower surface of each of the first anodes, the second anodes, and the electrode patterns is in contact with a planarization film.

15. The light emitting display device according to claim 1, wherein the vertical gap functions as a gate insulating film of an organic thin film transistor generated at a region of the bank.

16. The light emitting display device according to claim 1, wherein, when voltage is applied to the electrode patterns, dielectric polarization occurs in the vertical gap within the bank.

17. The light emitting display device according to claim 1, wherein carriers in the first common layer are transported closer to the cathode than the bank.

18. The light emitting display device according to claim 1, wherein an upper surface of the electrode patterns is covered by the bank.

19. The light emitting display device according to claim 1, wherein the vertical gap is disposed between an upper surface of each of the electrode patterns and an uppermost surface of the bank.

* * * * *